(12) United States Patent
Lin et al.

(10) Patent No.: US 12,174,229 B2
(45) Date of Patent: Dec. 24, 2024

(54) APPARATUS FOR MEASURING DYNAMIC ON-RESISTANCE OF NITRIDE-BASED SEMICONDUCTOR DEVICE

(71) Applicant: INNOSCIENCE (ZHUHAI) TECHNOLOGY CO., LTD., Zhuhai (CN)

(72) Inventors: Yiming Lin, Zhuhai (CN); Jianjian Sheng, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 17/923,598

(22) PCT Filed: Jul. 13, 2022

(86) PCT No.: PCT/CN2022/105334
§ 371 (c)(1),
(2) Date: Nov. 7, 2022

(87) PCT Pub. No.: WO2024/011436
PCT Pub. Date: Jan. 18, 2024

(65) Prior Publication Data
US 2024/0248124 A1    Jul. 25, 2024

(51) Int. Cl.
*G01R 27/08* (2006.01)
(52) U.S. Cl.
CPC ................... *G01R 27/08* (2013.01)
(58) Field of Classification Search
CPC ........................................... G01R 27/08
See application file for complete search history.

(56) References Cited

U.S. PATENT DOCUMENTS

| | | | | |
|---|---|---|---|---|
| 2008/0309355 A1* | 12/2008 | Nozaki | .............. | G01R 31/2621 324/754.01 |
| 2017/0254842 A1 | 9/2017 | Bahl et al. | | |

FOREIGN PATENT DOCUMENTS

| | | | |
|---|---|---|---|
| CN | 101324639 A | | 12/2008 |
| CN | 110850174 | * | 12/2008 |

(Continued)

OTHER PUBLICATIONS

WIPO, PCT International Search Report issued on Apr. 11, 2023.
WIPO, PCT Written Opinion issued on Apr. 11, 2023.

*Primary Examiner* — Alesa Allgood
(74) *Attorney, Agent, or Firm* — Li & Cai Intellectual Property (USA) Office

(57) ABSTRACT

An apparatus for measuring dynamic on-resistance of a device under test (DUT) is provided. The apparatus comprises a testing interface configured for coupling between the DUT and a measuring equipment; a first measuring circuit configured for sensing a drain-source voltage of the DUT and generating a first measuring signal proportional to the drain-source voltage; a current sensing circuit configured for sensing a drain current flowing from a drain to a source of the DUT and generating a current sensing signal; a second measuring circuit configured for receiving the current sensing signal and generating a second measuring signal proportional to the drain current; a first clamping circuit configured for eliminating overshoots in the first measuring signal; a second clamping circuit configured for eliminating overshoots in the second measuring signal. As the overshoot in the measuring voltage signals can be eliminated, the time required for the measuring signal to settle is shortened.

19 Claims, 7 Drawing Sheets

(56) References Cited

FOREIGN PATENT DOCUMENTS

| CN | 110174603 A | 8/2019 |
| CN | 110850174 A | 2/2020 |
| CN | 114128117 A | 3/2022 |
| CN | 114729958 A | 7/2022 |

* cited by examiner

APPARATUS FOR MEASURING DYNAMIC ON-RESISTANCE OF NITRIDE-BASED SEMICONDUCTOR DEVICE

FIELD OF THE INVENTION

The present invention generally relates to an apparatus for measuring dynamic on-resistance of electronic device. More specifically, the present invention relates to an apparatus for measuring dynamic on-resistance of a nitride-based semiconductor device.

BACKGROUND OF THE INVENTION

GaN-based devices have been widely used for high frequency electrical energy conversion systems because of low power losses and fast switching transition. In comparison with silicon metal oxide semiconductor field effect transistor (MOSFET), GaN high-electron-mobility transistor (HEMT) has a high breakdown-voltage and low on-resistance for high-power and high-frequency applications. For GaN HEMTs, there is a critical reliability issue: when the device is switching, its on-resistance will continue to rise as the operating time increases. This problem is also known as the dynamic resistance problem. Therefore, dynamic on-resistance measurement is important for performance evaluation and circuit diagnosis of GaN power devices. In order to evaluate the dynamic resistance characteristics of a GaN HEMT, a dynamic on-resistance is usually obtained by measuring the drain-source voltage and current of the device during the on-state of the device. Since the drain-source voltage of GaN HEMT is high at off state but very small at on state, the full range drain-to-source voltage of the GaN power device is too large for a typical measuring equipment. One approach to measure the full range drain-to-source voltage of the GaN power device is to use a clamping circuit to capture the turn-on voltage of the device under test and isolate the turn-off voltage of the device.

However, conventional clamping circuits may include clamping devices such as diodes and Si-MOS transistors which have junction capacitance. Such junction capacitance causes charge current $i_c$ (as shown FIG. 1A) when the device under test is switched on and discharge current id (as shown in FIG. 1B) when the device under test is switched off, resulting in voltage spikes occurs in waveforms of the clamped signals $V_{s1}$ and $V_{s2}$ as shown in FIG. 2. When using a measuring equipment (e.g., oscilloscope) to monitor the clamped signals $V_{s1}$ and $V_{s2}$, in order to avoid the over-range problem, it is necessary to adjust the measurement range of the oscilloscope to accommodate the voltage spikes, resulting in poor signal resolution and large error in the dynamic resistance value calculated from the measured signal. Similarly, the charge/discharge current caused by junction capacitance of electronic components in a current sampling circuit will also affect the accuracy of measured current sampling signal. Furthermore, the peak and trough voltage overshoot of the voltage and current sampling signals may cause signal ringing. A settling time is required before taking measurement which limits the operation frequency and in turn the application range of the testing circuit.

SUMMARY OF THE INVENTION

One objective of the present invention is to address the above-said issues in evaluating dynamic resistance characteristics of a GaN HEMT so as to provide a test platform for extremely high frequency aging tests.

In accordance with one aspect of the present disclosure, an apparatus for measuring dynamic on-resistance of a device under test (DUT) is provided. The apparatus comprises a testing interface configured for coupling between the DUT and a measuring equipment; a first measuring circuit configured for sensing a drain-source voltage of the DUT and generating a first measuring signal proportional to the drain-source voltage; a current sensing circuit configured for sensing a drain current flowing from a drain to a source of the DUT and generating a current sensing signal; a second measuring circuit configured for receiving the current sensing signal and generating a second measuring signal proportional to the drain current; a first clamping circuit configured for eliminating overshoots in the first measuring signal; a second clamping circuit configured for eliminating overshoots in the second measuring signal; a plurality of driving circuits configured for driving the DUT, the first measuring circuit, the second measuring circuit, the first clamping circuit and the second clamping circuit respectively; and a controller configured for controlling the plurality of driving circuits.

By operating the clamping circuits with a control logic provided by the present invention, the overshoot in the measuring voltage signals caused by the switching process of the device can be eliminated. The time required for the measuring signal to settle is greatly shortened. A greater measurement scale can be allowed and therefore, the measurement efficiency and accuracy can be improved.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components.

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1A:
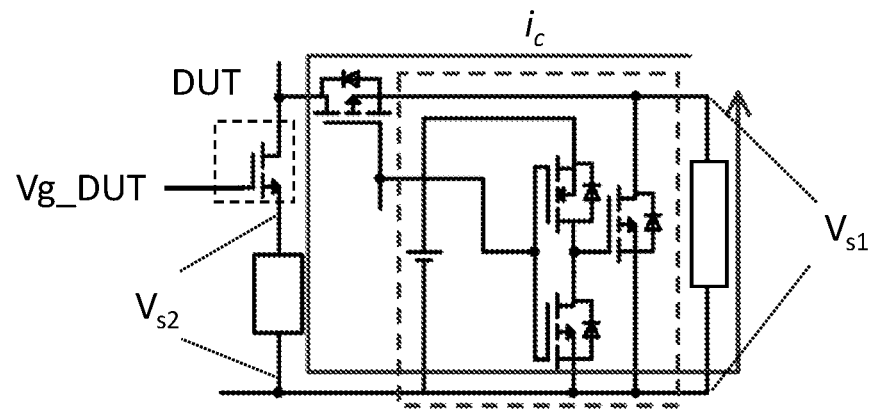
FIGS. 1A and 1B are circuit diagrams of a conventional dynamic on-resistance measuring circuit when the device under test is switched on and off respectively.
Figure 1B:
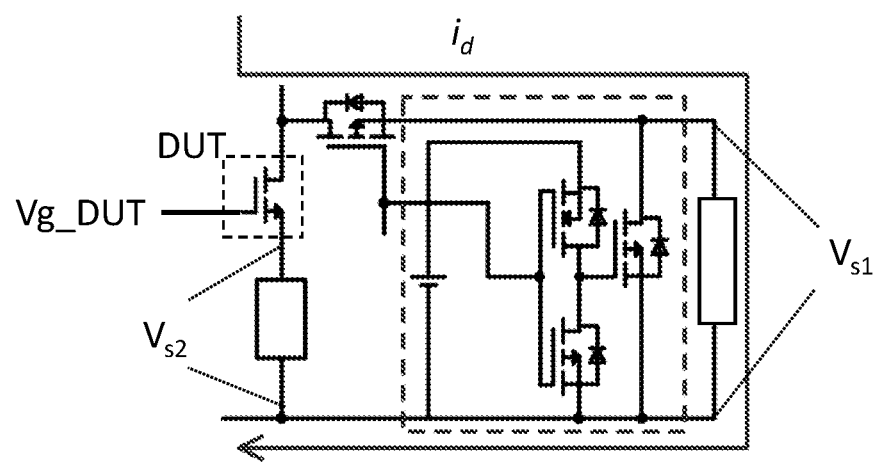
Figure 2:
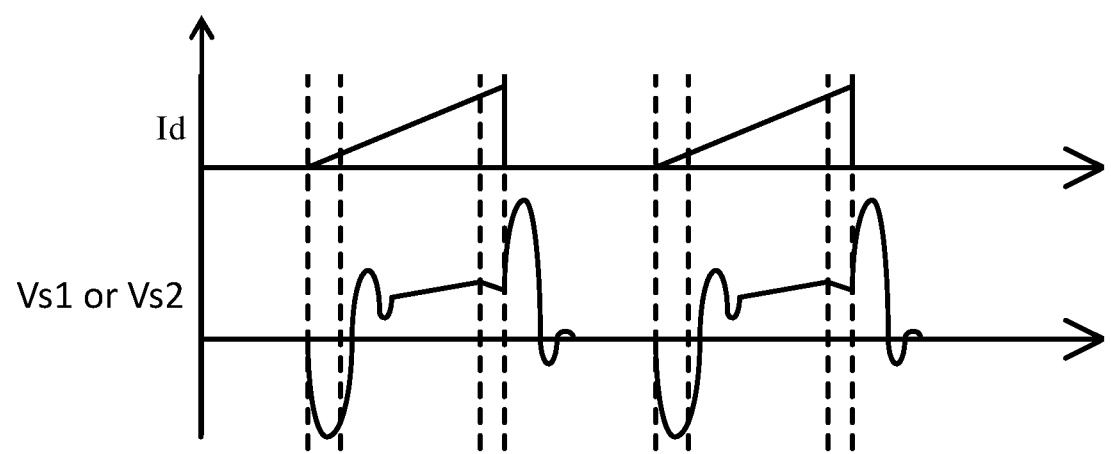
FIG. 2 are waveforms of electrical signals of the measuring circuit of FIG. 1.
Figure 3:
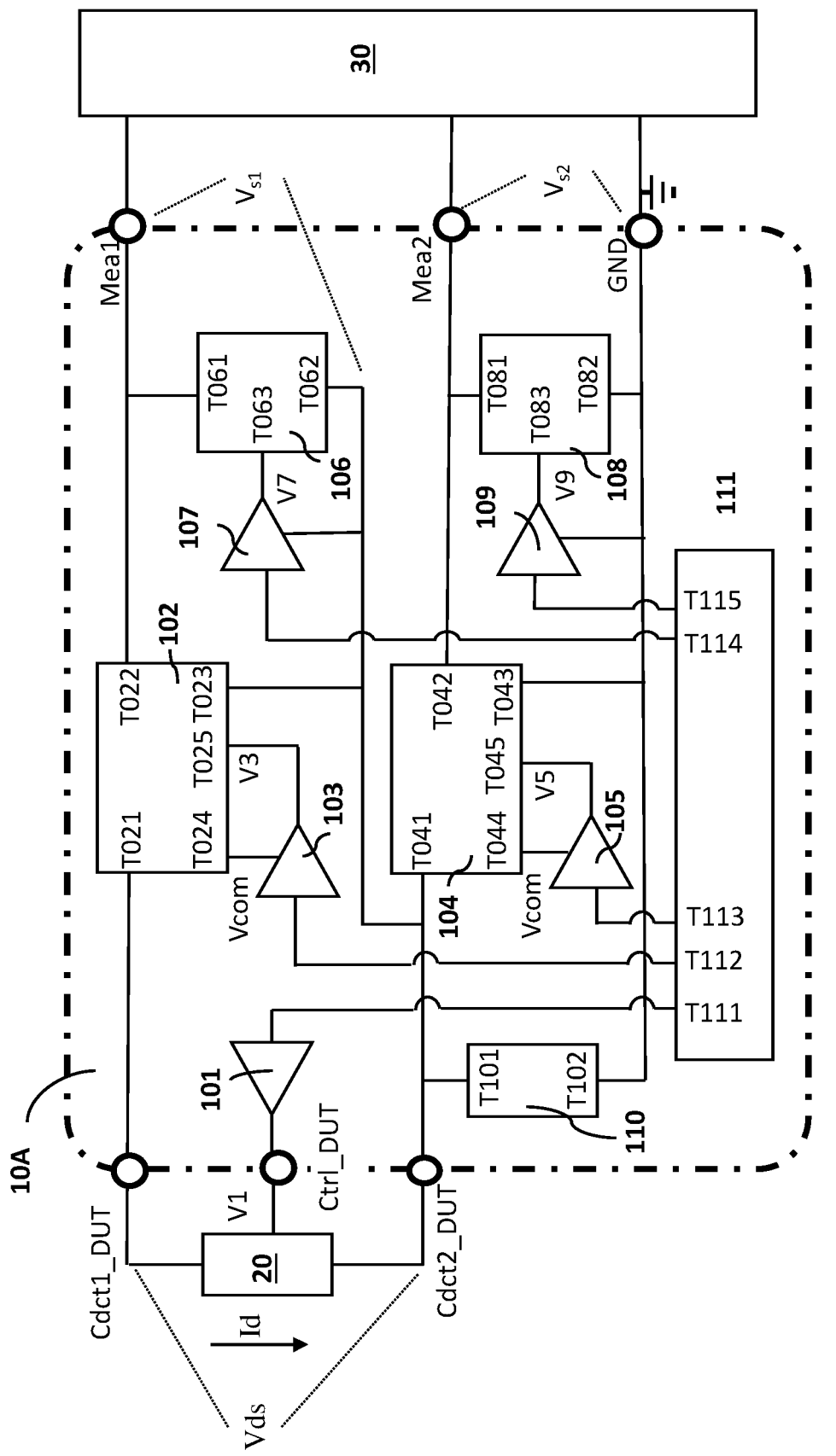
FIG. 3 shows a circuit block diagram of an apparatus for measuring dynamic on-resistance of a device under test (DUT) according to some embodiments of the present invention.

FIG. 3 shows a circuit block diagram of an apparatus 10A for measuring dynamic on-resistance of a device under test (DUT) 20 according to some embodiments of the present invention. As shown, the apparatus 10A may comprise a testing interface configured for coupling between the DUT 20 and a measuring equipment 30; a measuring circuit 102 configured for sensing a drain-source voltage Vds of the DUT 20 and generating a first measuring signal Vs1 proportional to the drain-source voltage Vds; a current sensing circuit 110 configured for sensing a drain current Id flowing from a drain to a source of the DUT 20 and generating a current sensing signal proportional to the drain current Id; a measuring circuit 104 configured for receiving the current sensing signal and generating a second measuring signal Vs2 proportional to the drain current Id; a clamping circuit 106 configure for eliminating overshoots in the first measuring signal Vs1 and a clamping circuit 108 configured for eliminating overshoots in the second measuring signal Vs2. The apparatus 10A may further comprise a plurality of driving circuits 101, 103, 105, 107, 109 configured for driving the DUT 20, the measuring circuits 102 and 104, the clamping circuits 106 and 108 respectively. The apparatus 10A may further comprise a controller 111 configured for controlling the driving circuits 101, 103, 105, 107, 109.

The testing interface may include a DUT control node Ctrl_DUT for connecting to a control terminal of the DUT 20; a first DUT conduction node Cdct1_DUT for connecting to a first conduction terminal of the DUT 20 and a second DUT conduction node Cdct2_DUT for connecting to a second conduction terminal of the DUT 20. In some embodiments, the DUT 20 may be a gallium nitride (GaN) high electron mobility transistor (HEMT) having a gate being the control terminal, a drain being the first conduction terminal and a source being the second conduction terminal.

The testing interface may further include a first measuring node Mea1 for connecting to a first input port of the measuring equipment 30; a second measuring node Mea2 for connecting to a second input port of the measuring equipment 30 and a ground node GND for connecting to ground.

The driving circuit 101 may have an output terminal connected to the DUT control node Ctrl_DUT. The driving circuit 101 may generate a driving signal V1 to the DUT through the DUT control node Ctrl_DUT.

The measuring circuit 102 may have a first conduction terminal T021 connected to the first DUT conduction node Cdct1_DUT, a second conduction terminal T022 connected to the first measuring node Mea1 and a reference terminal T023 connected to the second DUT conduction node Cdct2_DUT. The driving circuit 103 may have a first output terminal connected to a common-source terminal T024 of the measuring circuit 102 and a second output terminal connected to a control terminal T025 of the measuring circuit 102. The driving circuit 103 may generate a common source signal Vcom to the measuring circuit 102 through the common-source terminal T024. The driving circuit 103 may generate a driving signal V3 to the measuring circuit 102 through the control terminal T025.

The current sensing circuit 110 may have a first terminal T101 connected to the second DUT conduction node Cdct2_DUT and a second terminal T102 connected to the ground node GND. In some embodiments, the current sensing circuit 110 may include a resistor (not shown) having a first end electrically connected to the first terminal T101 and a second end electrically connected to the second terminal T102.

The measuring circuit 104 may have a first conduction terminal T041 connected to the second DUT conduction node Cdct2_DUT, a second conduction terminal T042 connected to the second measuring node Mea2 and a reference terminal T043 connected to the ground node GND. The driving circuit 105 may have a first output terminal connected to a common-source terminal T044 of the measuring circuit 104 and a second output terminal connected to a control terminal T045 of the measuring circuit 104. The driving circuit 105 may generate a common source signal Vcom to the measuring circuit 104 through the common-source terminal T024. The driving circuit 105 may generate a driving signal V5 to the measuring circuit 104 through the control terminal T045.

The clamping circuit 106 may have a first conduction terminal T061 connected to the first measuring node Mea1. The clamping circuit 106 may have a second conduction terminal T062 connected to the second DUT conduction node Cdct2_DUT. The driving circuit 107 may have an output terminal connected to a control terminal T063 of the clamping circuit 106 and generate a driving signal V7 to the clamping circuit 106.

The clamping circuit 108 may have a first conduction terminal T081 connected to the second measuring node Mea2. The clamping circuit 108 may have a second conduction terminal T082 connected to the ground node GND. The driving circuit 109 may have an output terminal connected to a control terminal T083 of the clamping circuit 110 and generate a driving signal V9 to the clamping circuit 110.

The controller 111 may have a first output terminal T111 connected to an input terminal of the driving circuit 101; a second output terminal T112 connected to an input terminal of the driving circuit 103; a third output terminal T113 connected to an input terminal of the driving circuit 105; a fourth output terminal T114 connected to an input terminal of the driving circuit 107; and a fifth output terminal T115 connected to an input terminal of the driving circuit 109.

The controller 111 may be configured to generate a first control signal to the driving circuit 101, a second control signal to the driving circuit 103, a third control signal to the driving circuit 105, a fourth control signal to the driving circuit 107 and a fifth control signal to the driving circuit 109.

The driving circuit 101 may be configured to receive a first control signal from the controller 111 and generate the first driving signal V1 to switch on and off the DUT 20.

The driving circuit 103 may be configured to receive a second control signal from the controller 111 and generate the second driving signal V3 to switch on and off the measuring circuit 102.

The driving circuit 105 may be configured to receive a third control signal from the controller 111 and generate the third driving signal V5 to switch on and off the clamping circuit 104.

The driving circuit 107 may be configured to receive a fourth control signal from the controller 111 and generate the fourth driving signal V7 to the clamping circuit 106 to switch on and off the clamping circuit 106.

The driving circuit 109 may be configured to receive a fifth control signal from the controller 111 and generate the fifth driving signal V9 to the clamping circuit 108 to switch on and off the clamping circuit 108.

Figure 4:
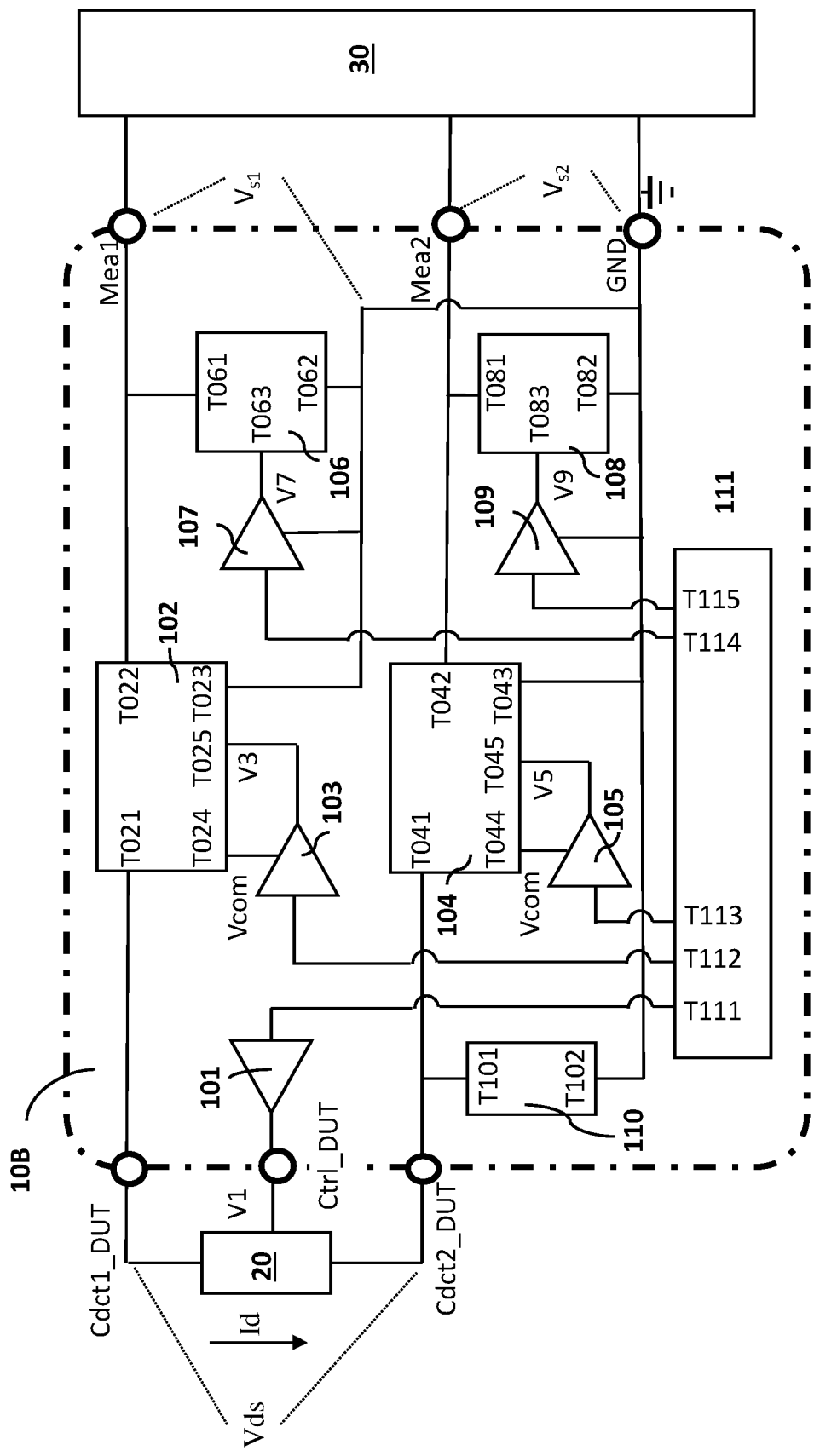
FIG. 4 shows a circuit block diagram of an apparatus for measuring dynamic on-resistance of a DUT according to some other embodiments of the present invention.

FIG. 4 shows a circuit block diagram of an apparatus 10B for measuring dynamic on-resistance of a device under test (DUT) 20 according to other embodiments of the present invention. The apparatus 10B is similar to the apparatus 10A. For conciseness, identical or similar elements in FIGS. 3 and 4 are given the same reference numerals and will not be further described in details. As shown in FIG. 4, the apparatus 10B is different from the apparatus 10A in that both of the reference terminal of the measuring circuit 102 and the second conduction terminal of the clamping circuit 106 are connected to the ground node GND instead of the second DUT conduction node Cdct2_DUT.

Figure 5:
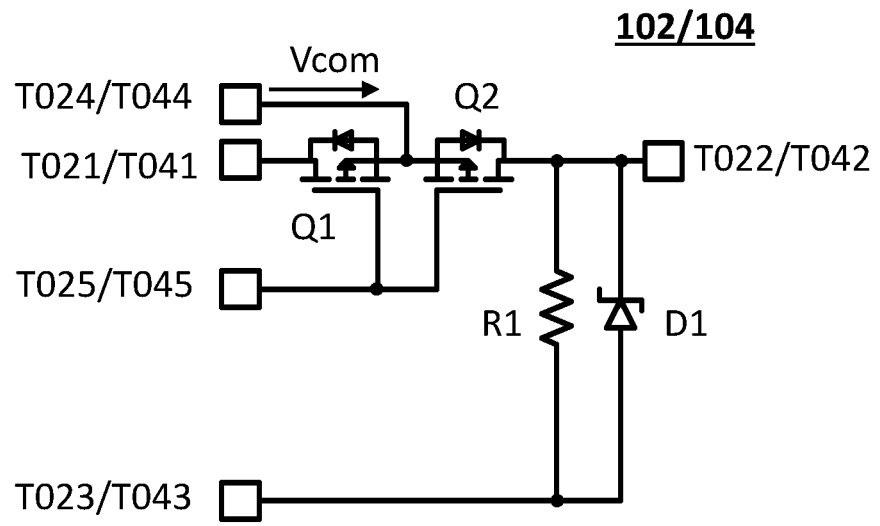
FIG. 5 shows an exemplary circuit diagram of a measuring circuit according to some embodiments of the present invention.

FIG. 5 shows an exemplary circuit diagram of the measuring circuit 102/104 according to some embodiments of the present invention. As shown, the circuit 102/104 may include a pair of enhancement-mode (E-mode) N-channel transistors Q1 and Q2, a resistor R1 and a diode DI. The transistor Q1 may have a drain connected to the first terminal T021/T041 of the circuit 102/104, a source connected to the fourth terminal T024/T044 of the circuit 102/104 and a gate connected to the fifth terminal T025/T045 of the circuit 102/104. The transistor Q2 may have a drain connected to the second terminal T022/T042 of the circuit 102/104, a source connected to the fourth terminal T024/T044 of the circuit 102/104 and a gate connected to the fifth terminal T025/T045 of the circuit 102/104. The resistor R1 may have a first end connected to the second terminal T022/T042 of the circuit 102/104 and a second end connected to the third terminal T023/T043 of the circuit 102/104. The diode DI may have an anode connected to the third terminal T023/T043 of the circuit 102/104 and a cathode connected to the second terminal T022/T042 of the circuit 102/104.

Figure 6:
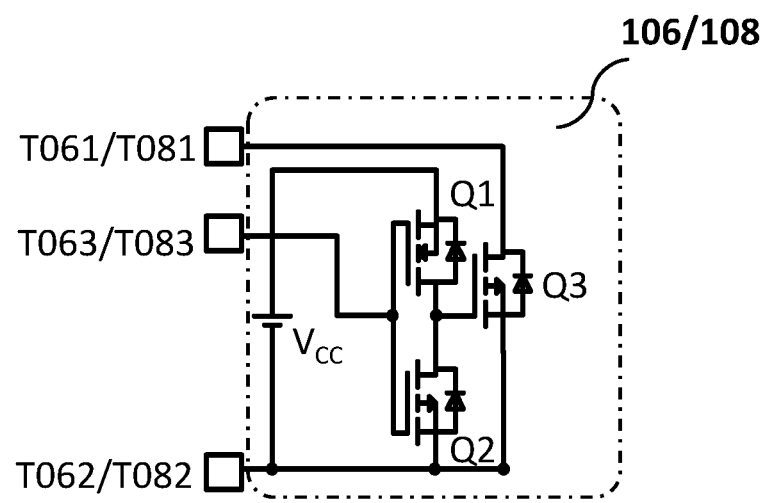
FIG. 6 shows another exemplary circuit diagram of a clamping circuit according to some embodiments of the present invention.

FIG. 6 shows an exemplary circuit diagram of the clamping circuit 106/108 according to some embodiments of the present invention. As shown, the circuit 106/108 may include a E-mode P-channel transistor Q1 and two E-mode N-channel transistors Q2 and Q3. The transistor Q1 may have a source connected to a DC power supply Vcc, a drain connected to a gate of the transistor Q3, and a gate connected to the control terminal T063/T083 of the circuit 106/108. The transistor Q2 may have a source connected to the second terminal T062/T082 of the circuit 106/108, a drain connected to a gate of the transistor Q3, and a gate connected to the control terminal T063/T083 of the circuit 106/108. The transistor Q3 may have a drain connected to the first conduction terminal T061/T081 of the circuit 106/108 and a source connected to the second conduction terminal T062/T082 of the circuit 106/108.

Figure 7:
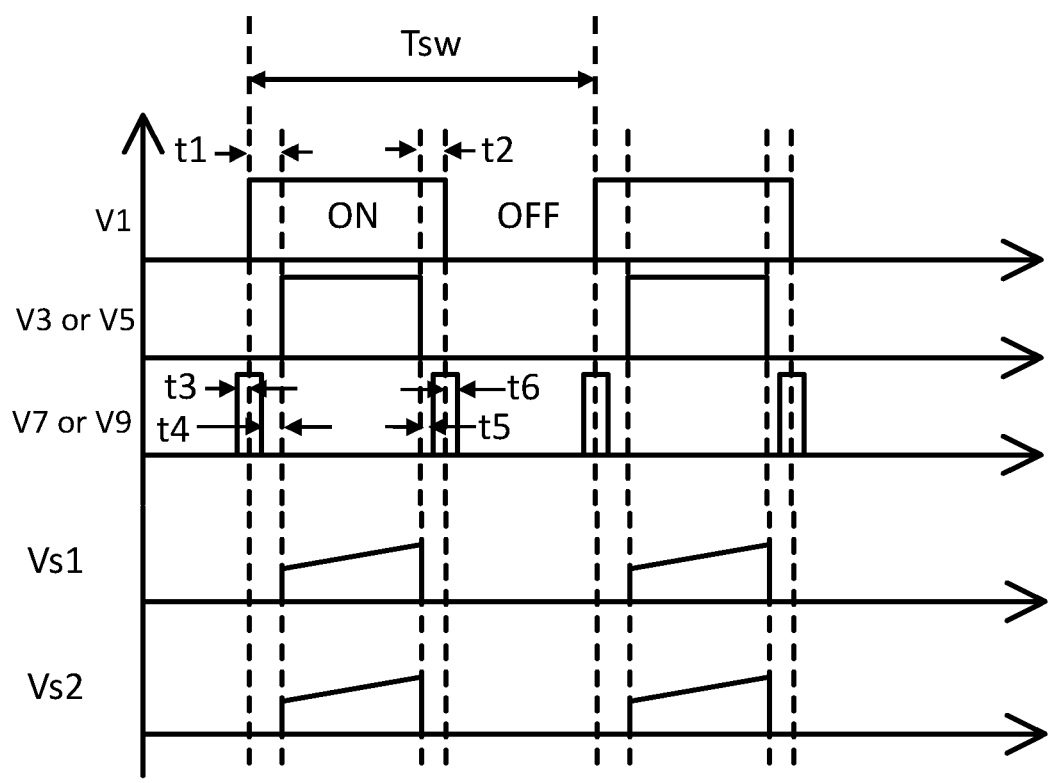
FIG. 7 shows waveforms of the driving signals for operating the apparatus and corresponding obtained measuring signals according to some embodiments of the present invention.

FIG. 7 shows waveforms of the driving signals V1, V3, V5, V7 and V9 for operating the apparatus 10A or 10B, as well as the obtained measuring signals Vs1 and Vs2 according to some embodiments of the present invention. As shown, the first driving signal V1 may have a waveform such that the DUT 20 is switched on and off with a switching cycle time Tsw.

The second driving signal V3 may have a waveform such that the measuring circuit 102 is turned on later than the DUT 20 being turned on for a first time interval t1 and the measuring circuit 102 is turned off earlier than the DUT 20 being turned off for a second time interval t2.

The third driving signal V5 may have a same waveform as that of the second driving signal V3. That is, the third driving signal V5 may have a waveform such that the measuring circuit 104 is turned on later than the DUT 20 being turned on for a first time interval t1 and the measuring circuit 104 is turned off earlier than the DUT 20 being turned off for a second time interval t2.

The fourth driving signal V7 may have a waveform such that the clamping circuit 106 is: turned on, at the first time within a switching cycle, earlier than the DUT 20 being turned on for a third time interval t3; turned off, at the first time within the switching cycle, earlier than the measuring circuit 102/104 being turned on for a fourth time interval t4; turned on, at the second time within the switching cycle, later than the measuring circuit 102/104 being turned off for a fifth time interval t5; and turned off, at the second time within the switching cycle, later than the DUT 20 being turned off for a sixth time interval t6. In some embodiments, the third time interval t3 is equal to the sixth time interval t6. The fourth time interval t4 is equal to the fifth time interval t5.

The fifth driving signal V9 may have a same waveform as that of the fourth driving signal V7. That is, the fourth driving signal V9 may have a waveform such that the clamping circuit 108 is: turned on, at the first time within a switching cycle, earlier than the DUT 20 being turned on for a third time interval t3; turned off, at the first time within the switching cycle, earlier than the measuring circuit 102/104 being turned on for a fourth time interval t4; turned on, at the second time within the switching cycle, later than the measuring circuit 102/104 being turned off for a fifth time interval t5; and turned off, at the second time within the switching cycle, later than the DUT 20 being turned off for a sixth time interval t6. In some embodiments, the third time interval t3 is equal to the sixth time interval t6. The fourth time interval t4 is equal to the fifth time interval t5.

As shown, by operating the testing apparatus 10A/10B with the driving signals V1, V3, V5, V7 and V9, there are no peak and trough overshoot in the waveforms of measuring signals Vs1 and Vs2. As a result, the accuracy of the dynamic on-resistance of the DUT 20, which is proportional to: Vs1/Vs2 when the testing apparatus 10A is used or (Vs1-Vs2)/Vs2 when the testing apparatus 10B is used, can be greatly improved.

Figure 8:
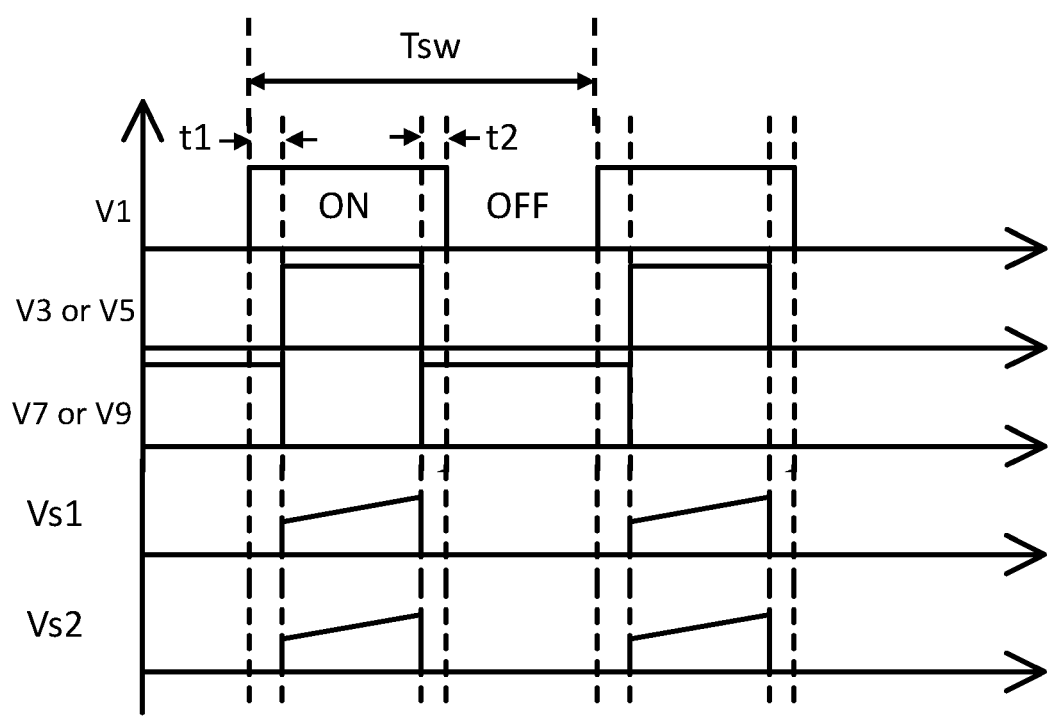
FIG. 8 shows waveforms of the driving signals for operating the apparatus and corresponding obtained measuring signals according to some embodiments of the present invention.

FIG. 8 shows waveforms of the driving signals V1, V3, V5, V6 and V9 for operating the apparatus 10A or 10B, as well as the obtained measuring signals Vs1 and Vs2 according to some other embodiments of the present invention. As shown, the first driving signal V1 may have a waveform such that the DUT 20 is switched on and off with a switching cycle time Tsw.

Similar to the embodiment of FIG. 7, the second driving signal V3 may have a waveform such that the measuring circuit 102 is turned on later than the DUT 20 being turned on for a first time interval t1 and the measuring circuit 102 is turned off earlier than the DUT 20 being turned off for a second time interval t2.

The third driving signal V5 may have a same waveform as that of the second driving signal V3. That is, the third driving signal V5 may have a waveform such that the measuring circuit 104 is turned on later than the DUT 20 being turned on for a first time interval t1 and the measuring circuit 104 is turned off earlier than the DUT 20 being turned off for a second time interval t2.

Different from the embodiment of FIG. 7, the fourth driving signal V7 may have a waveform such that the clamping circuit 106 is: turned off when the measuring circuit 102/104 is turned on; and turned on when the measuring circuit 102/104 is turned off.

The fifth driving signal V9 may have a same waveform as that of the fourth driving signal V7. That is, the fifth driving signal V9 may have a waveform such that the clamping circuit 108 is: turned off when the measuring circuit 102/104 is turned on; and turned on when the measuring circuit 102/104 is turned off.

As shown, by operating the testing apparatus 10A/10B with the driving signals V1, V3, V5, V6 and V9 there are no peak and trough overshoot in the waveforms of measuring signals Vs1 and Vs2. As a result, the accuracy of the dynamic on-resistance of the DUT 20, which is proportional to: Vs1/Vs2 when the testing apparatus 10A is used or (Vs1-Vs2)/Vs2 when the testing apparatus 10B is used, can be greatly improved.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. An apparatus for measuring dynamic on-resistance of a device under test (DUT), comprising:
   a testing interface configured for coupling between the DUT and a measuring equipment;
   a first measuring circuit configured for sensing a drain-source voltage of the DUT and generating a first measuring signal proportional to the drain-source voltage;
   a current sensing circuit configured for sensing a drain current flowing from a drain to a source of the DUT and generating a current sensing signal proportional to the drain current;
   a second measuring circuit configured for receiving the current sensing signal and generating a second measuring signal proportional to the drain current;
   a first clamping circuit configured for eliminating overshoots in the first measuring signal;
   a second clamping circuit configured for eliminating overshoots in the second measuring signal;
   a plurality of driving circuits configured for driving the DUT, the first measuring circuit, the second measuring circuit, the first clamping circuit and the second clamping circuit respectively; and
   a controller configured for controlling the plurality of driving circuits;
   wherein the testing interface includes:
      a DUT control node for connecting to a control terminal of the DUT;
      a first DUT conduction node for connecting to a first conduction terminal of the DUT;
      a second DUT conduction node for connecting to a second conduction terminal of the DUT;
      a first measuring node for connecting to a first input port of the measuring equipment;
      a second measuring node for connecting to a second input port of the measuring equipment; and
      a ground node for connecting to ground;
   and wherein:
      the first measuring circuit has a first conduction terminal connected to the first DUT conduction node, a second conduction terminal connected to the first measuring node and a reference terminal connected to the second DUT conduction node;
      the current sensing circuit has a first terminal connected to the second DUT conduction node and a second terminal connected to the ground node;
      the second measuring circuit has a first conduction terminal connected to the second DUT conduction node, a second conduction terminal connected to the second measuring node and a reference terminal connected to the ground node;
      the first clamping circuit has a first conduction terminal connected to the first measuring node and a second conduction terminal connected to the second DUT conduction node; and
      the second clamping circuit having a first conduction terminal connected to the second measuring node and a second conduction terminal connected to the ground node.

2. The apparatus according to claim 1, wherein the plurality of driving circuits includes:
   a first driving circuit having an output terminal connected to the DUT control node Ctrl_DUT;
   a second driving circuit having an output terminal connected to a control terminal of first measuring circuit;
   a third driving circuit having an output terminal connected to a control terminal of second measuring circuit;
   a fourth driving circuit having an output terminal connected to a control terminal of the first clamping circuit; and
   a fifth driving circuit having an output terminal connected to a control terminal of the second clamping circuit.

3. The apparatus according to claim 2, wherein the controller comprises:
   a first output terminal connected to an input terminal of the first driving circuit;
   a second output terminal connected to an input terminal of the second driving circuit;
   a third output terminal connected to an input terminal of the third driving circuit;
   a fourth output terminal connected to an input terminal of the fourth driving circuit; and
   a fifth output terminal connected to an input terminal of the fifth driving circuit.

4. The apparatus according to claim 3, wherein the controller is configured to:
   generate a first control signal to the first driving circuit to switch on and off the DUT with a switching cycle time; and
   generate a second control signal to the second driving circuit to switch on and off the first measuring circuit and a third control signal to the second driving circuit to switch on and off the second measuring circuit such that the first measuring circuit and the second measuring circuit are turned on later than the DUT being turned on for a first time interval and the first measuring circuit is turned off earlier than the DUT being turned off for a second time interval.

5. The apparatus according to claim 4, wherein the controller is further configured to generate a fifth control signal to the fifth driving circuit to switch on and off the second clamping circuit such that the second clamping circuit is:
turned on, at the first time within a switching cycle, earlier than the DUT being turned on for a third time interval;
turned off, at the first time within the switching cycle, earlier than the second measuring circuit being turned on for a fourth time interval;
turned on, at the second time within the switching cycle, later than the second measuring circuit being turned off for a fifth time interval; and
turned off, at the second time within the switching cycle, later than the DUT being turned off for a sixth time interval.

6. The apparatus according to claim 4, wherein the controller is further configured to generate a fourth driving signal to the fourth driving circuit to switch on and off the first clamping circuit such that the first clamping circuit is:
turned off when the first measuring circuit is turned on; and
turned on when the first measuring circuit is turned off.

7. The apparatus according to claim 4, wherein the controller is further configured to generate a fifth driving signal to the fifth driving circuit to switch on and off the second clamping circuit such that the second clamping circuit is:
turned off when the second measuring circuit is turned on; and
turned on when the second measuring circuit is turned off.

8. The apparatus according to claim 4, wherein the controller is further configured to generate a fourth control signal to the fourth driving circuit to switch on and off the first clamping circuit such that the first clamping circuit is:
turned on, at the first time within a switching cycle, earlier than the DUT being turned on for a third time interval;
turned off, at the first time within the switching cycle, earlier than the first measuring circuit being turned on for a fourth time interval;
turned on, at the second time within the switching cycle, later than the first measuring circuit being turned off for a fifth time interval; and
turned off, at the second time within the switching cycle, later than the DUT being turned off for a sixth time interval.

9. The apparatus according to claim 8, wherein the third time interval is equal to the sixth time interval; and the fourth time interval is equal to the fifth time interval.

10. An apparatus for measuring dynamic on-resistance of a device under test (DUT), comprising:
a testing interface configured for coupling between the DUT and a measuring equipment;
a first measuring circuit configured for sensing a drain-source voltage of the DUT and generating a first measuring signal proportional to the drain-source voltage;
a current sensing circuit configured for sensing a drain current flowing from a drain to a source of the DUT and generating a current sensing signal proportional to the drain current;
a second measuring circuit configured for receiving the current sensing signal and generating a second measuring signal proportional to the drain current;
a first clamping circuit configured for eliminating overshoots in the first measuring signal;
a second clamping circuit configured for eliminating overshoots in the second measuring signal;
a plurality of driving circuits configured for driving the DUT, the first measuring circuit, the second measuring circuit, the first clamping circuit and the second clamping circuit respectively; and
a controller configured for controlling the plurality of driving circuits;
wherein the testing interface includes:
a DUT control node for connecting to a control terminal of the DUT;
a first DUT conduction node for connecting to a first conduction terminal of the DUT;
a second DUT conduction node for connecting to a second conduction terminal of the DUT;
a first measuring node for connecting to a first input port of the measuring equipment;
a second measuring node for connecting to a second input port of the measuring equipment; and
a ground node for connecting to ground;
and wherein:
the first measuring circuit has a first conduction terminal connected to the first DUT conduction node, a second conduction terminal connected to the first measuring node and a reference terminal connected to the ground node;
the current sensing circuit has a first terminal connected to the second DUT conduction node and a second terminal connected to the ground node;
the second measuring circuit has a first conduction terminal connected to the second DUT conduction node, a second conduction terminal connected to the second measuring node and a reference terminal connected to the ground node;
the first clamping circuit has a first conduction terminal connected to the first measuring node and a second conduction terminal connected to the ground node; and
the second clamping circuit having a first conduction terminal connected to the second measuring node and a second conduction terminal connected to the ground node.

11. The apparatus according to claim 10, wherein the plurality of driving circuits includes:
a first driving circuit having an output terminal connected to the DUT control node Ctrl_DUT;
a second driving circuit having an output terminal connected to a control terminal of first measuring circuit;
a third driving circuit having an output terminal connected to a control terminal of second measuring circuit;
a fourth driving circuit having an output terminal connected to a control terminal of the first clamping circuit; and
a fifth driving circuit having an output terminal connected to a control terminal of the second clamping circuit.

12. The apparatus according to claim 11, wherein the controller comprises:
a first output terminal connected to an input terminal of the first driving circuit;
a second output terminal connected to an input terminal of the second driving circuit;
a third output terminal connected to an input terminal of the third driving circuit;

a fourth output terminal connected to an input terminal of the fourth driving circuit; and a fifth output terminal connected to an input terminal of the fifth driving circuit.

13. The apparatus according to claim 12, wherein the controller is configured to:

generate a first driving signal to the first driving circuit to switch on and off the DUT with a switching cycle time; and generate a second driving signal to the second driving circuit to switch on and off the first measuring circuit and a third control signal to the second driving circuit to switch on and off the second measuring circuit such that the first measuring circuit and the second measuring circuit are turned on later than the DUT being turned on for a first time interval and the first measuring circuit is turned off earlier than the DUT being turned off for a second time interval.

14. The apparatus according to claim 13, wherein the controller is further configured to generate a fifth control signal to the fifth driving circuit to switch on and off the second clamping circuit such that the second clamping circuit is:

turned on, at the first time within a switching cycle, earlier than the DUT being turned on for a third time interval;

turned off, at the first time within the switching cycle, earlier than the second measuring circuit being turned on for a fourth time interval;

turned on, at the second time within the switching cycle, later than the second measuring circuit being turned off for a fifth time interval; and turned off, at the second time within the switching cycle, later than the DUT being turned off for a sixth time interval.

15. The apparatus according to claim 13, wherein the controller is further configured to generate a fourth driving signal to the fourth driving circuit to switch on and off the first clamping circuit such that the first clamping circuit is:

turned off when the first measuring circuit is turned on; and turned on when the first measuring circuit is turned off.

16. The apparatus according to claim 13, wherein the controller is further configured to generate a fifth driving signal to the fifth driving circuit to switch on and off the second clamping circuit such that the second clamping circuit is:

turned off when the second measuring circuit is turned on; and turned on when the second measuring circuit is turned off.

17. The apparatus according to claim 13, wherein the controller is further configured to generate a fourth driving signal to the fourth driving circuit to switch on and off the first clamping circuit such that the first clamping circuit is:

turned on, at the first time within a switching cycle, earlier than the DUT being turned on for a third time interval;

turned off, at the first time within the switching cycle, earlier than the first measuring circuit being turned on for a fourth time interval;

turned on, at the second time within the switching cycle, later than the first measuring circuit being turned off for a fifth time interval; and turned off, at the second time within the switching cycle, later than the DUT being turned off for a sixth time interval.

18. The apparatus according to claim 17, wherein the third time interval is equal to the sixth time interval; and the fourth time interval is equal to the fifth time interval.

19. An apparatus for measuring dynamic on-resistance of a device under test (DUT), comprising:

a testing interface configured for coupling between the DUT and a measuring equipment;

a first measuring circuit configured for sensing a drain-source voltage of the DUT and generating a first measuring signal proportional to the drain-source voltage;

a current sensing circuit configured for sensing a drain current flowing from a drain to a source of the DUT and generating a current sensing signal proportional to the drain current;

a second measuring circuit configured for receiving the current sensing signal and generating a second measuring signal proportional to the drain current;

a first clamping circuit configured for eliminating overshoots in the first measuring signal;

a second clamping circuit configured for eliminating overshoots in the second measuring signal;

a plurality of driving circuits configured for driving the DUT, the first measuring circuit, the second measuring circuit, the first clamping circuit and the second clamping circuit respectively; and a controller configured for controlling the plurality of driving circuits;

wherein the testing interface includes a DUT control node for connecting to a control terminal of the DUT;

wherein the plurality of driving circuits includes:

a first driving circuit having an output terminal connected to the DUT control node;

a second driving circuit having an output terminal connected to a control terminal of first measuring circuit;

a third driving circuit having an output terminal connected to a control terminal of second measuring circuit;

a fourth driving circuit having an output terminal connected to a control terminal of the first clamping circuit; and a fifth driving circuit having an output terminal connected to a control terminal of the second clamping circuit.

* * * * *